United States Patent [19]

Nakajo et al.

[11] 4,321,654

[45] Mar. 23, 1982

[54] FRAME UNIT FOR ELECTRONIC COMMUNICATION DEVICES

[75] Inventors: Toshihiko Nakajo, Machida; Yoshihiro Takahashi; Katsuo Okuyama, both of Kawasaki; Yutaka Matsukuma, Hatano, all of Japan

[73] Assignee: Fujitsu Limited, Kawasaki, Japan

[21] Appl. No.: 141,083

[22] PCT Filed: Oct. 20, 1978

[86] PCT No.: PCT/JP78/00002

§ 371 Date: Aug. 16, 1979

§ 102(e) Date: Jul. 13, 1980

[87] PCT Pub. No.: WO79/00397

PCT Pub. Date: Jul. 12, 1979

[30] Foreign Application Priority Data

Dec. 16, 1977 [JP] Japan ............................... 52-150571

[51] Int. Cl.³ ............................................. H05K 7/18
[52] U.S. Cl. ...................................... 361/396; 211/41; 108/64; 312/111; 361/415

[58] Field of Search ..................... 220/4 C, 4 D, 23.4, 220/23.6; 108/64; 211/41; 312/107, 111, 223; 361/393–395, 413, 415, 396, 429; 339/17 LM, 17 M, 17 N

[56] References Cited

U.S. PATENT DOCUMENTS

| | | | |
|---|---|---|---|
| 3,159,438 | 12/1964 | Carlson | 312/111 |
| 3,468,591 | 9/1969 | Wodli | 312/111 |
| 3,640,399 | 2/1972 | Hartman | 361/415 |
| 3,696,936 | 10/1972 | Straccia | 361/415 |
| 3,723,823 | 3/1973 | Lit | 361/415 |
| 3,751,127 | 8/1973 | Black, Jr. | 312/111 |
| 3,755,630 | 8/1973 | Boyer | 361/415 |
| 3,846,678 | 11/1974 | Klein | 361/393 |

*Primary Examiner*—Gerald P. Tolin
*Attorney, Agent, or Firm*—Staas & Halsey

[57] ABSTRACT

This application discloses a frame unit for communication and other electronic devices including a pair of parallel side plates interconnected by upper and lower guide rails extending between and perpendicular to the side plates, and a plurality of guide members which are secured to the guide rails and which are adapted to guide therealong printed boards on which circuit elements of an electronic device are provided. The application also discloses a frame device composed of a number of such frame units.

3 Claims, 7 Drawing Figures

FRAME UNIT FOR ELECTRONIC COMMUNICATION DEVICES

BACKGROUND OF THE INVENTION

This invention relates to a frame unit for communication and other electronic devices, and also to a frame device constructed by a number of such frame units.

A known conventional frame device for electronic communication devices is usually composed of a number of communication device units which are laid one on another in and secured to a single main frame. Each communication device unit includes a box-like casing in which are arranged and held a number of equidistantly spaced printed circuit boards which are provided with circuit elements of an electronic communication device thereon. Each communication device unit is secured to the main frame by means of set screws which are inserted in holes formed in flange portions of the casing and in holes formed in the main frame, corresponding to the first mentioned holes of the casing. After the installation of a predetermined number of communication device units in the main frame, necessary wiring of the units is effected with the help of cables, wires or the like, in accordance with the arrangement of the units. Further, the provision of heat radiation openings on at least a ceiling plate and a bottom plate of the casing is required for radiation of heat from the printed circuit boards into the atmosphere. Furthermore, in the above mentioned type of known frame device, when an increase of the capacity of the electronic communication device is expected in the future, it is necessary to prepare in advance a larger main frame having extra space in which additional communication device units, necessary to satisfy the requirement of the increase of the capacity, can be installed. On the other hand, once the size of the main frame is determined, the main frame is not adaptable to an optional increase of the capacity of the device, i.e., an optional increase of the number of units. Still further, since no conventional frame device is adaptable to different combinations or arrangements of the units, it is necessary to prepare a number of frame devices, the number of which corresponds to the number of the combinations or arrangements, resulting in various modifications of the arrangement of the wiring. This makes it difficult to make the wiring arrangement uniform. Furthermore, due to the fact that each unit includes a box-like casing, which is, in turn, installed in a main frame, the device is relatively large and heavy on the whole, and accordingly, is inconvenient, particularly when it is transported.

SUMMARY OF THE INVENTION

An object of the invention is, therefore, to provide a frame unit which can be constructed without the provision of such a main frame.

Another object of the invention is to provide a frame unit which can be freely and optionally constructed and assembled.

Still another object of the invention is to provide a frame unit which makes it possible to increase the capacity of the frame device.

A further object of the invention is to provide a uniform frame unit.

According to the invention, there is provided a frame unit for electronic communication devices comprising a pair of spaced parallel side plates which are interconnected by means of upper and lower guide rails extending between and perpendicular to the side plates, both ends of said guide rails projecting out of the side plates, and a plurality of guide members which are secured to the guide rails and which are adapted to guide therealong printed boards on which circuit elements of an electronic communication device are provided, when the printed boards are inserted into and out of the frame unit, said guide members being spaced a predetermined distance from one another between and parallel to the side plates.

Further, according to the invention, there is also provided a frame device composed of a number of the above mentioned type frame units, in a matrix arrangement.

DETAILED DESCRIPTION

The invention will become apparent from the detailed description of the preferred embodiments presented below, with reference to the accompanying drawings.

Figure 1:
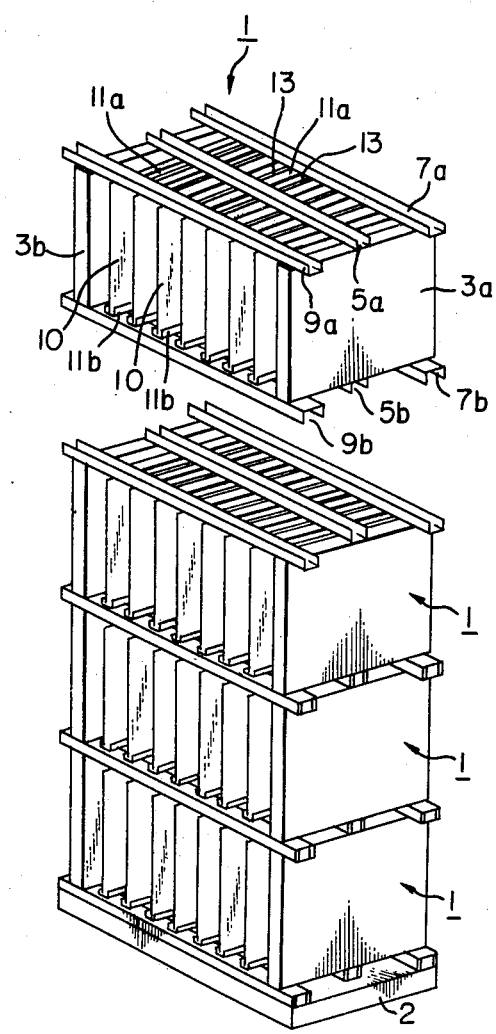
FIG. 1 is a perspective view showing an assembly of a frame unit according to the invention.

A frame unit 1 according to the invention includes a pair of parallel side plates 3a and 3b, and three pairs of U shaped upper and lower guide rails 5a, 5b; 7a, 7b; and 9a, 9b (FIG. 1). The upper guide rails 5a, 7a and 9a have a U shaped guide channel of the same width $L_1$ while the lower guide rails 5b, 7b and 9b have a U shaped guide channel of the same width $L_2$ (FIG. 2B). The width $L_1$ is different from the width $L_2$. In the illustrated embodiment, $L_2$ is larger than $L_1$ ($L_2 > L_1$), but $L_2$ may be smaller than $L_1$. It is important that the widths $L_1$ and $L_2$ are not equal to each other. The outer dimension of the smaller guide rail must be substantially equal to or slightly less than the inner dimension of the other guide rail, so that former guide rail can be fitted in latter guide rail. Preferably, the guide rails 9a, 9b and 7a, 7b have the same length, which is slightly longer than the distance between the two side plates 3a and 3b, so that the two ends of each of these guide rails project outward from the side plates. Although the intermediate guide rails 5a and 5b may be of same length as the guide rails 9a, 9b and 7a, 7b, they preferably have the same length as the distance between the two side plates 3a, 3b for the purpose mentioned hereinafter. The number of pairs of upper and lower guide rails is not limited to three, and a pair, two pairs or more than three pairs of guide rails may be provided. Essentially, only one pair of upper and lower guide rails is necessary. Each of the guide rails can be secured to the side plates 3a and 3b, for example, by means of set screws (not shown).

Between the side plates 3a and 3b, are arranged pairs of upper and lower guide members 11a and 11b, which extend parallel to the side plates. The guide members 11a and 11b are secured to the guide rails 5a, 7a and 9a, and 5b, 7b and 9b, respectively. Pairs of guide members 11a, 11b are spaced at a predetermined distance. The number of pairs of guide members corresponds to the number of printed circuit boards 10 which are to be guided along the guide members. Each of the guide members 11a and 11b is also in the form of a U shaped guide rail in the illustrated embodiment. The printed circuit boards 10 are guided by and slide in a corresponding pair of guide rails 11a and 11b when the printed circuit boards 10 are inserted in and out of the unit 1. The printed circuit boards 10 are provided with predetermined circuit elements, such as electronic circuit components (not shown).

Figure 2A:
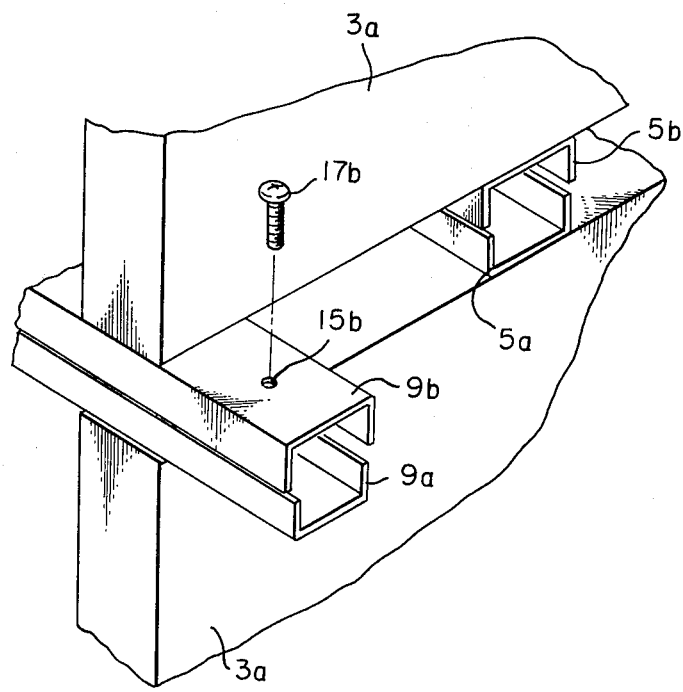
FIG. 2A is a perspective view showing a part of upper and lower frame units which are laid one on top of the other and interconnected by means of a set screw.
Figure 2B:
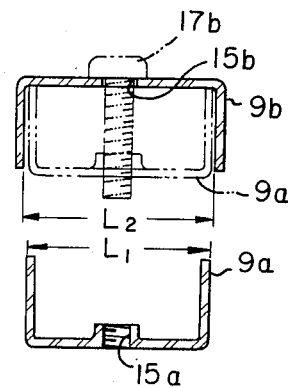
FIG. 2B is a cross sectional view of FIG. 2A.

As can be seen from FIGS. 2A and 2B, the projecting ends of each of the guide rails 7b and 9b are provided with mounting holes 15b (one of which is shown in FIG. 2A), while the projecting ends of each of the guide rails 7a and 9a are provided with mounting holes in the form of threaded holes 15a (one of which is shown in FIG. 2B) corresponding to the holes 15b. When fixtures, such as set screws 17b, are inserted in the mounting holes 15b and screwed in the threaded holes 15b, two adjacent upper and lower units 1 are immovably connected together. That is, in order to interconnect two vertically adjacent units 1, which are laid one on top of the other, the upper unit is put on the lower unit in such a way that the upper guide rails 5a, 7a and 9a of the lower unit are fitted in the lower guide rails 5b, 7b and 9b of the upper unit, respectively. After that, the four set screws 17b are inserted in the four mounting holes 15b of the upper unit and screwed in the four threaded holes 15a of the lower unit, so that the two units can be rigidly interconnected at four points. The above mentioned operation can be repeated every time a unit is laid on the lower unit to form a frame device which is constructed of a plurality of units successively laid on one another. It should be noted that spaces 13 defined between the guide rails 11a and between the guide rails 11b serve as heat radiation openings through which heat from the printed circuit boards 10 radiates into the atmosphere.

Figure 3:
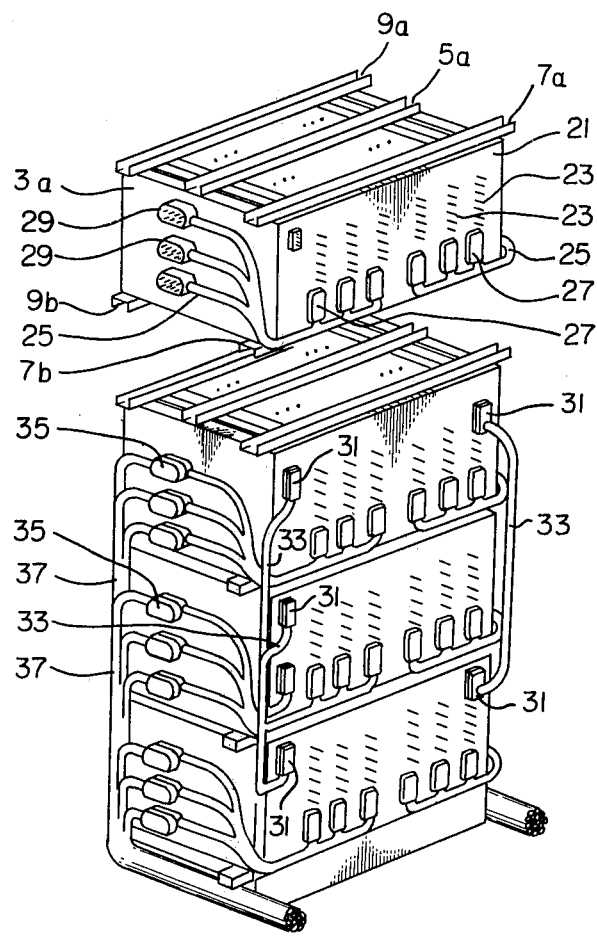
FIG. 3 is a backward perspective view showing a plurality of frame units which are electrically independent from one another.

In FIG. 3 are illustrated frame units which are also electrically independent of one another. In FIG. 3, each frame unit further includes a back panel 21 which is secured to the rear portions of the side plates 3a and 3b. On the front face of the back panel 21 are provided a group of connectors (not shown), with which are engaged, in plug-in manner, connectors (not shown) provided on the rear portions of the printed circuit boards 10. Each back panel 21 is also provided, on its rear or back face, with a group of connectors 23 to which other connectors (not shown) are to be connected. A part or all of the connectors 23 can be connected, if necessary, to connectors 27 provided on one of the ends of cables or leads 25, which have at their other ends connectors 29, which are in turn secured to the outer side faces of the side plates 3a and 3b. The connectors 23, 27 and 29, may be female connectors or male connectors. The units 1 are thus electrically separated from one another. The electrical connection between the electrically independent units 1 can be established, for example, by means of connection cables 33, each having, at both ends, connectors 31. The units 1 can be also connected to an external apparatus (not shown) by means of connection cables 37 having connectors 35.

The projecting ends of the guide rails 7a, 7b, 9a, 9b provide a lateral gap, between two laterally adjacent units which are interconnected in the horizontal direction. Due to the presence of the lateral gap between two laterally adjacent units, the connectors 29 can be also provided on the outer side faces of the side plates 3a and 3b. Due to the fact that the intermediate guide rails 5a and 5b have no projecting end, that is, the length thereof is substantially equal to the distance between the two side plates 3a and 3b, the connectors 35 can be easily connected to the corresponding connectors 29 and the connection cables 37 can pass through spaces defined between the projecting ends of upper guide rails 9a and 7a, and between the projecting ends of lower guide rails 9b and 7b, respectively.

Figure 4:
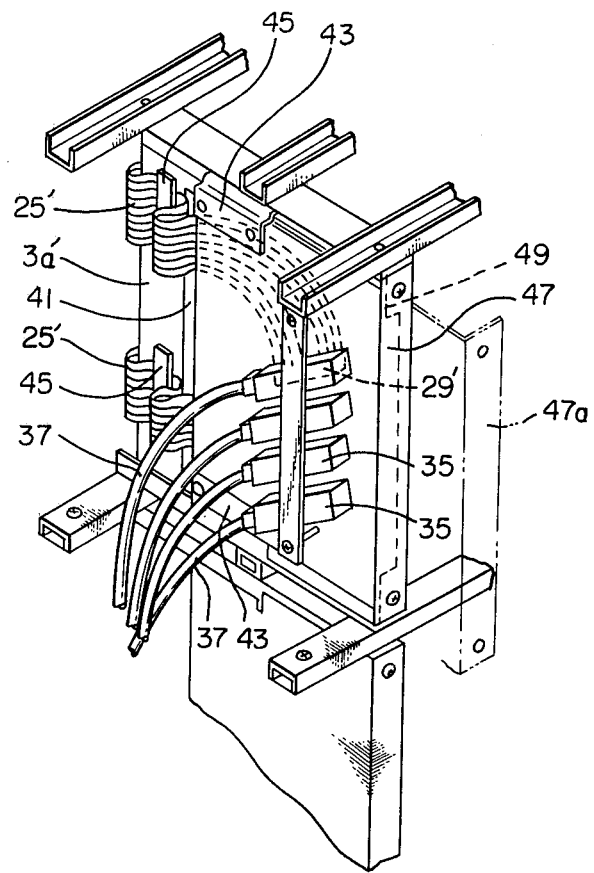
FIG. 4 is a perspective view showing a main part of a modification of FIG. 3.

In FIG. 4, which illustrates a modification of FIG. 3, each of the side plates is in the form of a frame plate 3a' having a rectangular opening 41. Flexible flat cables 25' connected at their one end to the connectors 23 provided on the back panel 21 extend through the openings 41. Preferably, on the frame plate 3a' there are provided guide plates 45 secured thereto for guiding the flexible flat cables 25' in order to prevent the cables 45 from undesirably hanging down. Each of the flexible cables 45 is provided, at its two ends, with a connector (not shown) similar to the connector 27 (FIG. 3) and a connector 29' (FIG. 4). The frame plate 3a' is provided with a connector mounting plate 47, which is slidably guided by guide plates 43 secured to the frame plate 3a'. Connector mounting plate 47, which has a substantially L-shaped cross section, includes flange portion 47a which can be withdrawn to the position shown by the dot and dash line in FIG. 4. That is, the stop 49 limits the outward movement of the plate 47, so that the plate 47 can be prevented from accidentally coming out from the frame plate 3a' during the outward movement of the plate 47. On the two faces of each of the connector mounting plates 47 there are provided groups of connectors (not shown). The connectors provided on the inner face of the plate 47 are connected to the connectors 29' of the cables 25' and the connectors provided on the outer face of the plate 47 are connected in a plug-in manner, for example, to connectors 35 of connection cables 37 to be connected to an external apparatus (not shown). Although the above discussion has been directed only to the plate 3a', of the two side plates, it is, of course, adaptable to the other side plate (not shown).

According to the embodiment illustrated in FIG. 4, connections and disconnections between the connectors provided on the connector mounting plates 47, and the connectors 29' and/or 35, can be more easily effected in comparison with the embodiment illustrated in FIG. 3, in which such operations must be effected in the limited space between two laterally adjacent units. This is because the plates 47 can be drawn outward from the respective side plates in the first mentioned embodiment when the connecting and disconnecting operations mentioned above are effected.

Figure 6:
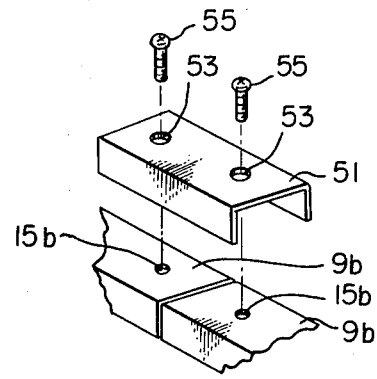
FIG. 6 is a perspective view of the connection between two horizontally adjacent frame units.

When a number of units 1 are connected horizontally, coupling members 51, as illustrated in FIG. 6, can be used. The coupling member 51 may be a strip having a U shaped cross section. The inner width of the U shaped channel of the coupling member 51 is substantially equal to or slightly larger than the outer width of the U shaped channel of the guide rails 7b, 9b, so that the guide rails 7b or 9b can be fitted into the coupling member 51. The coupling member 51 has two mounting holes 53, 53 corresponding to the mounting holes 15b, 15b of the guide rails 7b, 7b or 9b, 9b of the two horizontally adjacent units 1, as shown in FIG. 6.

Figure 5:
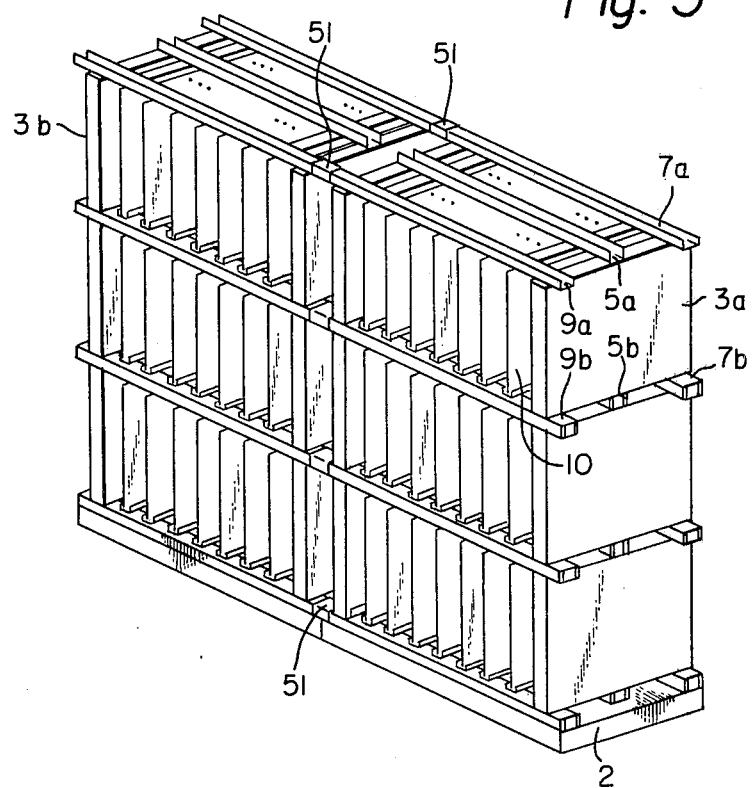
FIG. 5 is a perspective view of a frame device according to the invention.

Four frame units, comprising two horizontally adjacent upper units and two horizontally adjacent lower units, on which the two upper units are laid, can be rigidly interconnected to one another by means of the coupling members 51, in such a way that the lower guide rails 5b, 7b, 9b of the upper units 1, which are aligned in a horizontal direction are engaged with the corresponding upper guide rails 5a, 7a, 9a of the lower units 1, which are similarly aligned in a horizontal direction. After that the coupling members 51 are disposed on the adjacent and horizontally aligned lower rails 9b, 9b and 7b, 7b of the upper units, in which are fitted the upper rails 9a, 9a and 7a, 7a of the lower units, respectively. Finally, set screws 55 are inserted into the holes 53 of the coupling members 51 and in the holes 15b of the lower rails 9b and 7b, and are then screwed in the threaded holes 15a of the upper rails 9a and 7a. It will be noted that each hole 53, 15b and 15a is aligned in a vertical direction. By repeating the above mentioned operation, a predetermined number of units can be assembled in a matrix arrangement to form a finished frame device as shown in FIG. 5.

A frame device may be assembled, for example, on a base 2 (FIGS. 1 and 5) or a box (not shown) in which an electric power unit (not shown) is installed. Alternatively, it is also possible to provide a cabinet (not shown) in which a frame device is housed to protect it from dust or the like.

As will be apparent from the above discussion, according to the invention, since a communication device unit itself constitutes a frame device unit, and since a number of frame device units can be directly and easily assembled to form a frame device, the disadvantages mentioned above can be eliminated. Furthermore, according to the invention, frame device units can be electrically independent from one another and electrical connections between the units can be easily effected in an optional arrangement.

We claim:

1. A frame unit for electronic devices, comprising: a pair of spaced parallel side plates; at least one pair of upper and lower guide rails interconnecting said side plates by extending between and perpendicular to the side plates, both ends of said guide rails projecting beyond the side plates; and a plurality of guide member means for guiding therealong printed boards on which circuit elements of an electronic device are provided, when the printed boards are inserted into and out of the frame unit, said guide member means being secured to said guide rails and being spaced a predetermined distance from one another between and parallel to the side plates, wherein said upper and lower guide rails comprise guide channels, respectively, the width ($L_1$) of the guide channel of each upper guide rail being different from the width ($L_2$) of the guide channel of each lower guide rail, whereby the guide rails having narrower guide channels can be fitted in the other guide rails having wide guide channels when a plurality of frame units are laid one on top of the other, and wherein each of said projecting ends of the guide rails is provided with a mounting hole, and further comprising a plurality of set screw means for insertion in the mounting holes to rigidly connect a plurality of frame units when the latter are laid one on top of the other.

2. A frame unit for electronic devices, comprising: a pair of spaced parallel side plates; upper and lower guide rails means for interconnecting said side plates, said upper and lower guide rail means having guide channels with different guide channel widths ($L_1$, $L_2$), respectively, and extending between and perpendicular to the side plates, both ends of said guide rail means projecting beyond the side plates; a plurality of guide members secured to the guide rail means to guide therealong printed boards having circuit elements and connectors provided thereon, when the printed boards are inserted into and out of the frame unit, said guide members being spaced at a predetermined distance from one another between and parallel to the side plates; and a back panel parallel to the guide rail means and secured to the side plates, said back panel having, on its front face, a plurality of connectors engageable in plug-in manner with corresponding connectors of the printed boards and, on its back face, a plurality of connectors to which other connectors may be connected, and wherein each of said parallel side plates comprises a frame plate having a center opening, said side plates being provided with connector mounting plates slideably mounted on the outer faces of the respective side plates, said connector mounting plates being provided, on their outer and inner faces, with a plurality of outer connectors and a plurality of inner connectors, respectively, said inner connectors being connected to the connectors on the back face of the back panel by flexible connecting cables.

3. A frame device for electronic devices, comprising:
a plurality of frame units in a matrix arrangement, each comprising
a pair of spaced parallel side plates,
upper and lower guide rail means for interconnecting said side plates, said upper and lower guide rail means having guide channels with different channel widths, respectively, and extending between and perpendicular to the side plates, both ends of said guide rail means projecting beyond the side plates and being provided with mounting holes,
a plurality of fixing members insertable into said mounting holes, and
a plurality of guide members secured to the guide rail means to guide therealong printed boards having circuit elements of an electronic device provided thereon, when the printed boards are inserted into and out of the frame unit, said guide members being spaced a predetermined distance from one another between and parallel to the side plates, said frame units being laid on one another in vertical directions by engaging the upper guide rail means of the lower frame units with the lower guide rail means of the upper frame units, said frame units being aligned in horizontal directions by aligning the upper and lower guide rails means of horizontally adjacent units, respectively; and
a plurality of coupling members having mounting holes corresponding to said mounting holes of said guide rail means, said coupling members joining the guide rail means of adjacent frame units with said fixing members being inserted in and secured to said mounting holes to rigidly secure the frame units together.

* * * * *

UNITED STATES PATENT AND TRADEMARK OFFICE
CERTIFICATE OF CORRECTION

PATENT NO. : 4,321,654
DATED : March 23, 1982
INVENTOR(S) : Nakajo et al.

It is certified that error appears in the above—identified patent and that said Letters Patent is hereby corrected as shown below:

Front page [86], line 3, "Jul. 13, 1980" should be
    --Jul. 13, 1979--.

Front page [56] References Cited,
    line 3, after "Carlson" insert --et al.--;
    line 6, after "Straccia" insert --et al.--;
    line 7, after "Lit" insert --et al.--.

Col. 4, line 4, after "gap" delete ",".

Col. 5, line 11, after "direction" insert --,--.

Col. 6, line 5, "rails" should be --rail--;
    line 59, "rails" should be --rail--.

Front page [22], "Oct. 20, 1978" should be

--Oct. 2, 1978--.

Signed and Sealed this

Twenty-first Day of September 1982

[SEAL]

Attest:

GERALD J. MOSSINGHOFF

Attesting Officer

Commissioner of Patents and Trademarks